United States Patent [19]

Iisaka et al.

[11] 4,001,062

[45] * Jan. 4, 1977

[54] VARIABLE SCALE RELIEF REPRODUCTION PROCESS AND PRODUCT THEREOF

[75] Inventors: Yoshiharu Iisaka; Yasuo Katsurada; Shigeo Suzuki, all of Tokyo; Takatoshi Saijo, Kawasaki, all of Japan

[73] Assignee: Kyodo Insatsu Kabushiki Kaisha, Tokyo, Japan

[ * ] Notice: The portion of the term of this patent subsequent to July 24, 1990, has been disclaimed.

[22] Filed: May 19, 1975

[21] Appl. No.: 578,789

Related U.S. Application Data

[63] Continuation of Ser. No. 355,609, April 30, 1973, abandoned, which is a continuation-in-part of Ser. No. 889,369, Dec. 31, 1969, Pat. No. 3,748,202.

[30] Foreign Application Priority Data

Apr. 19, 1969 Japan .............................. 44-30474

[52] U.S. Cl. ................................. 156/59; 96/36.3; 101/211; 264/225; 264/132

[51] Int. Cl.² ...................... G03C 5/00; B29C 1/02

[58] Field of Search ............... 96/36, 36.3; 156/59; 101/211; 264/132, 225

[56] References Cited

UNITED STATES PATENTS

| | | | |
|---|---|---|---|
| 576,640 | 2/1897 | Weimann | 156/59 |
| 1,350,365 | 8/1920 | Fuelling | 101/211 X |
| 1,376,653 | 5/1921 | Steedman | 156/277 X |
| 2,050,595 | 8/1936 | Wolfe | 204/159.14 X |
| 2,379,218 | 6/1945 | Dial et al. | 264/22 X |
| 2,390,618 | 12/1945 | Roehm | 101/211 X |
| 3,190,947 | 6/1965 | Norcross | 264/225 X |
| 3,345,939 | 10/1967 | Jemseby | 101/211 X |
| 3,456,586 | 7/1969 | Andrus | 264/225 X |
| 3,748,202 | 7/1973 | Iisaka et al. | 156/59 |

*Primary Examiner*—Edward C. Kimlin
*Attorney, Agent, or Firm*—Blum, Moscovitz, Friedman & Kaplan

[57] ABSTRACT

Reproductions of works of art or other artifacts in which the surface irregularities are reproduced as well as the colors of the original, are prepared by forming a mold which reproduces in negative form the surface irregularities of the original, preparing a transparent moldment in said mold, preparing a photographic reproduction of the original to the same scale as the moldment, and joining the moldment and the reproduction in registry. The mold may be prepared either by casting on the original work of art or artifact to be reproduced, or on a reproduction prepared manually by a skilled artisan, the latter technique making it possible to vary the scale of the reproduction. Where the scale of the mold is different from that of the original, the scale of the photographic reproduction is changed correspondingly.

27 Claims, 18 Drawing Figures

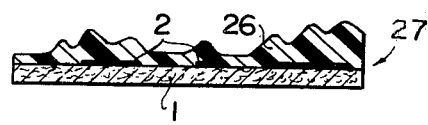
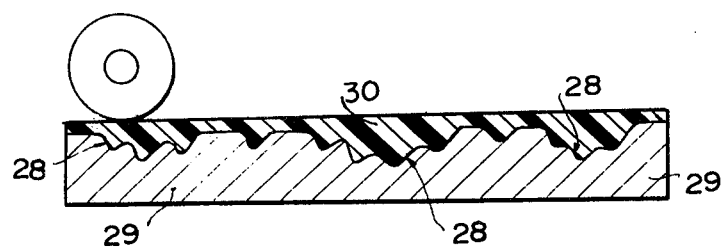
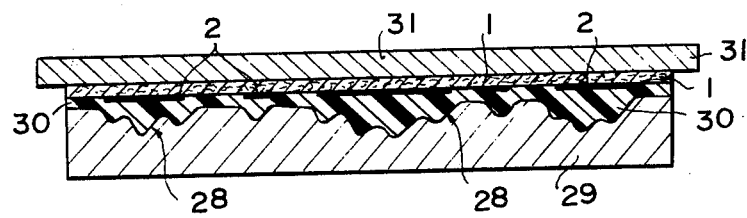

VARIABLE SCALE RELIEF REPRODUCTION PROCESS AND PRODUCT THEREOF

CROSS REFERENCE TO RELATED APPLICATION

This is a continuation, of application Ser. No. 355,609, filed Apr. 30, 1973 now abandoned, the latter being a Continuation-in-part application of our Application Ser. No. 889,369 filed Dec. 31, 1969 which issued to Pat. No. 3,748,202.

BACKGROUND OF THE INVENTION

With the spreading of the art produced by various cultures across the boundaries of the regions in which the art is produced, a great demand has developed for reproductions of art works such as oil paintings, textiles, and wood carvings, as well as reproductions of natural articles such as insects, wood grain and other attractive objects. Some of the reproductions are desired for educational purposes as well as for decorative value. Up to now, it has been possible to reproduce items such as those listed by photographic processes which render color more or less faithfully, but it has not been possible to reproduce surface irregularities corresponding to brush strokes, crevices in the carapace of an insect, or low-relief carving in wood or other materials.

Some effort has been made to give the feeling of a more faithful reproduction of oil paintings, particularly, by the use of processes such as embossing of the paper. However, such processes have heretofore failed to reproduce brush strokes where relatively sharp angles are involved, this being particularly pertinent to modern works of art. Similarly, low-relief carving may also present the problem of sharp angles which cannot be satisfactorily reproduced by embossing since the substrate, whether of paper or of canvas is apt to tear in such regions.

In another process having the same objective of producing a three-dimensional appearance, it has been the practice to subject the eventual duplicate of an embossing process to spraying with a special resin powder and heating the sprayed substrate to cause the powder to adhere to the substrate. The surface is rough but, nevertheless, does not reproduce satisfactorily as the surface of the original. The principle reason for this is that the block used for embossment has been prepared through manual engraving. Alternatively, the block may be prepared by forming an electrotype in which recesses correspond to raised portions of the block. Plaster is put into the electrotype and hardened. The electrotype is then used as a male mold and the plaster molding as the female. Usually, a number of such female molds are produced and combined into sets for use. Another known technique is to form surface irregularities by pressing a photographic reproduction with a metal die having irregularities in registry with the printed pattern. By this method, a prototype is pressed against a combination of a metal plate or the like and a rubber cloth to make a form. Then, patterns are formed in conformity with the irregular surface of the rubber cloth. In the next step, the metal plate or the like is separated leaving a flat surface. Then the patterns are printed on the metal plate or the like and finally the prototype is pressed against the back side so as to form the pattern and surface irregularities simultaneously.

Despite the effort expended thus far, it has been difficult to reproduce fine irregularities representing brush strokes and knife cuts so that the articles produced by such processes are immediately recognizable as immitations. Consequently, a process for replication of art works and the like in which both color and surface irregularities are faithfully reproduced has long been desired. In our copending application as identified above, we have presented a process for replication of such art works and the like in which both color and surface irregularities are faithfully reproduced. The process of the copending application, however, is limited to reproduction on essentially the same scale as the original. Where the original may be either too small or too large with regard to the desired reproduction, the process as presented in the present application overcomes this difficulty. Furthermore, when the item to be reproduced is fragile, either chemically or mechanically, the process of the present application can be utilized.

A further difficulty encountered with conventional processes is that a press is required for forming the surface irregularities, generally heating being required with pressure, so that this method cannot be practised in a conventional print shop where this kind of equipment is generally not available.

SUMMARY OF THE INVENTION

To prepare replicas in mass production of original works of art or artifacts or natural objects, all of such items having surface texture or irregularities as well as colors to be reproduced, a mold is prepared by casting a hardenable resin on the surface of said object and causing said resin to harden. The mold is then used for preparing transparent castings one surface of which is a replica of the subject and the opposite surface of which is flat. Further, a photograhic reproduction to scale is made of the object to be replicated. The moldment, i.e., the piece prepared in the mold, is then joined in registry with the photographic reproduction. If desired, the photographic reproduction can be made on a canvas or other textured material similar to that used in the object being reproduced. The product or replica produced in this way is virtually indistinguishable from the original.

Where the item to be reproduced is fragile, either chemically or mechanically, or where it is unavailable for use in preparing a mold, a reproduction of the surface, to any desired scale, is made by a skilled artisan using materials such as wax, or a hardenable material such as a paint. From this manually-fashioned reproduction of the surface of the subject, a mold is prepared as by casting with a hardenable resin, by the use of plaster of Paris or by an electrotyping process, all of these procedures being conventional. A photographic reproduction of the subject item is then made, the scale of the photographic reproduction being the same as the scale of the reproduction of the surface of the item. Reproductions, essentially in sheet form, of the surface of the subject item are produced using the mold, the reproductions having one flat surface. The reproduction of the surface is then united, at the flat surface thereof, with the photographic reproduction. Again, a replica or reproduction prepared in this way is virtually indistinguishable from the original.

Accordingly, an object of the present invention is a process for the reproduction of works of art, artifacts, carvings, insects, etc., all of said items having surfaces which are irregular and of low-relief, where the reproductions simulate both color and surface of the original sufficiently closely so that they are virtually indistinguishable from the original subject.

Another object of the present invention is to provide an improved process for the replication of items such as those disclosed wherein the process is inexpensive, is suitable to large scale production, and which results in replicates which are virtually indistinguishable from the subject item being reproduced.

A further object of the present invention is to provide an improved process for the replication of colored items of low-relief wherein the use of a press is avoided.

An important object of the present invention is to provide replicas of works of art, carvings and other objects of low-relief where said replicas are virtually indistinguishable from the original.

A significant object of the present invention is to provide an improved process for preparing replicas of items of low relief which are virtually indistinguishable from the original subjects, except as to scale.

Yet another object of the present invention is to provide replicas of colored objects of low-relief wherein the replicas are virtually indistinguishable from the subject item except as to scale.

Still other objects and advantages of the invention will in part be obvious and will in part be apparent from the specification.

The invention accordingly comprises the several steps and the relation of one or more of such steps with respect to each of the others, and the article possessing the features, properties and the relation of elements, which are exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 14 is a color reproduction of original subject matter to any desired scale;

FIG. 15 is a transparent replica of an irregular surface of a subject item superimposed on a color reproduction of said item said replica being prepared by a skilled artisan.

FIG. 16 shows a metal mold prepared from the replica of FIG. 15 being used for the preparation of another replica utilizing a roller for the elimination of the air bubbles between the metal mold and the replica;

FIG. 17 shows the replica of FIG. 16 united with the color reproduction of FIG. 14, the two being in registry with each other; and FIG. 18 shows the completed replica prepared from the handmade copy of FIG. 15.

DESCRIPTION OF THE PREFERRED EMBODIMENTS

Figure 1:
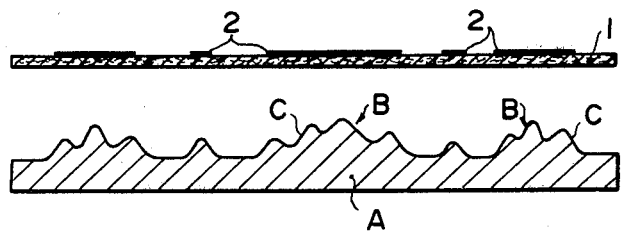
FIG. 1 represents schematically a color reproduction of an object A having an irregular surface.

A work of art or other item of low-relief to be reproduced is indicated by the letter A in FIG. 1 where the subject matter has a color pattern B and an irregular surface indicated by C. A color reproduction is prepared by any of the well known methods such as by the preparation of yellow, magenta, cyan and black negatives, using color separation photography and printing the respective color patterns 2 on a base sheet 1.

Figure 3:
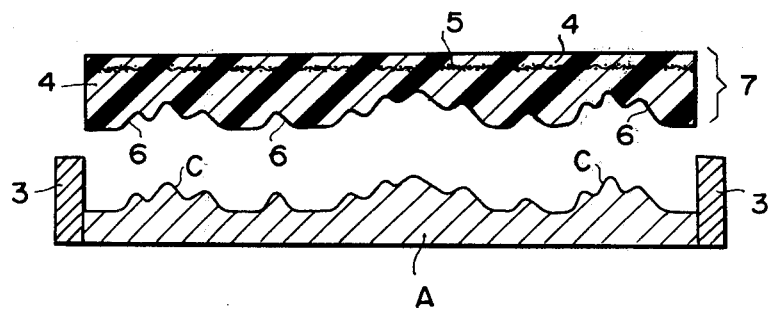
FIG. 3 shows the mold of the object A separated therefrom.

To form a mold for reproducing the surface irregularities of the subject matter, the object A may be surrounded by walls 3 to form a container, after which a hardenable material in fluid form is poured into the container formed by the walls 3 and the object A. A suitable material is a silicone hardenable to a rubber at normal room temperature by the use of a suitable hardening agent, for instance 3% of dimethylamine, to which may also be added a suitable auxiliary additive such as 5% of dimethyl chlorosilane for adjusting the fluidity of the mix and the final hardness. The fluid is poured onto the irregular face C which is directed upwardly and is uniformly spread out eventually forming a mold 4 having an upper surface which is flat. While the eventual mold layer 4 is still in a relatively soft condition, a non-elastic film or sheet 5 which may be of a polyester resin or glass fiber is inserted into the mold material as shown in FIG. 3. To obtain strong bonding between the final mold layer 4 and shape retaining member 5, a non-woven cloth or a thick woven cloth 5' may be placed in the mold layer 4 underneath the layer of polyester film or glass fiber 5. Further, air bubbles should be purged or removed before hardening of the eventual mold layer 4 at normal temperature.

Once mold layer 4 is completely hardened, it is separated from subject matter A, as a result of which a mold 7 having an irregular face 6 complementary to the irregular face C of the original subject matter is obtained as shown in FIG. 3. When made of the silicone rubber described above, the mold 7 is transparent or translucent despite the presence of the non-elastic member 5 or the layer 5'. The significance of this feature will shortly become apparent.

Figure 2:
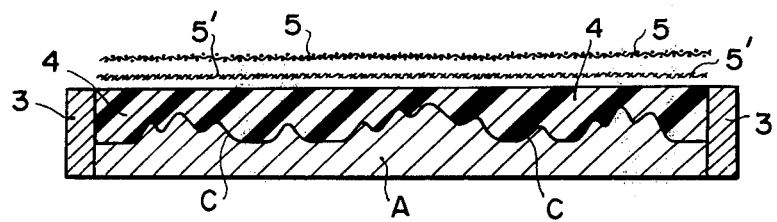
FIG. 2 shows a method of casting a mold which is a negative of the object A and also shows strengthening materials for incorporation in the mold where the mold is flexible.
Figure 4:
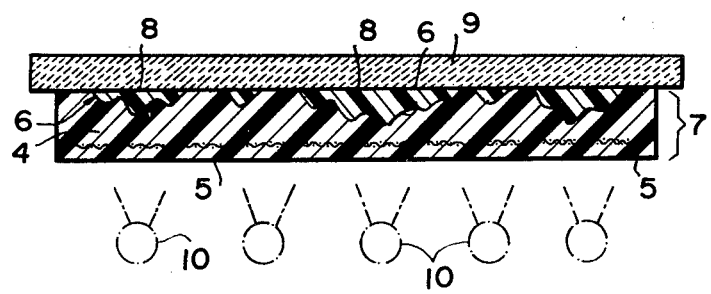
FIG. 4 shows a replica of the surface being hardened by light, the mold being transparent or translucent.

After the mold is separated from the original subject matter, it is placed in a horizontal position with its rough or irregular face directed upward (FIG. 4). If desired, a frame (not shown) may be built around it in the manner of frame 3 of FIG. 2. Mold 7 is then filled with a light-sensitive material polymerizable to a transparent resin 8 by means of exposure to said light. There are many resins suitable for the purpose, such as those which form unsaturated radicals and give rise to radical polymerization to form polyesters, alkyds or acrylics. Bridging agents such as styrene and methyl methacrylate plus a polymerization initiating agent such as diphenyl disulfate and benzoic methyl ether may also be present in the mixture used to fill the mold 7. Air bubbles present in the light-sensitive synthetic resin 8 and excessive resin are removed or expelled by use of a doctor blade (not shown) or a squeeze roller. It is then desirable that the system be covered with a flat, smooth and non-permeable sheet, such as a glass plate 9 to protect the resin from air. Then, the light-sensitive resin 8 with which the irregular recesses or depressions 6 in the permeable mold 7 have been filled is hardened by exposure to light transmitted through mold 7. It is for this reason that mold 7 should be made of a light-permeable material. In a test example, where the maximum thickness of the light-sensitive resin layer 8 was 1.4mm, sufficient hardening could be obtained by exposure to light from light sources 10, each of the light sources being an ultraviolet lamp of the 60-watt diazo fluoroescent type at a distance of 10 cm, the duration of the exposure being 5 to 7 minutes.

Figure 5:
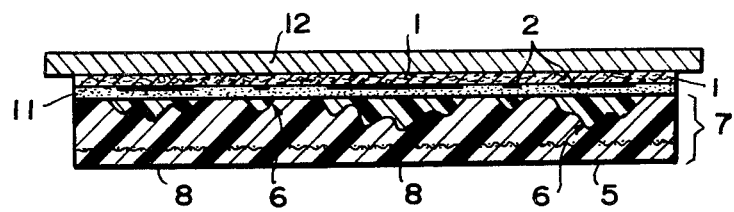
FIG. 5 shows a color reproduction of the object placed in registry with a replica of the surface of the object being reproduced.

Once the light-hardenable material 8 is polymerized, sheet 9 is removed and a photographic reproduction consisting of a base sheet 1 carrying color patterns 2 imprinted thereon is applied over the flat top surface of the hardened light-sensitive layer 8 using a transparent or semi-transparent adhesive layer 11, the photographic reproduction being placed carefully in registry with the irregularities 6 of the molded layer 8. If desired, pressure may be applied between the photographic reproduction and irregular layer 8 by means of a flat plate 12 (FIG. 5).

Figure 6:
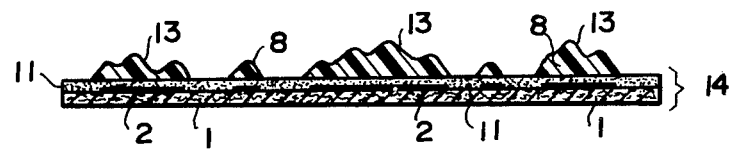
FIG. 6 is a duplicate with respect to both color and surface irregularities of the original subject matter.

When the now-integral structure which is a replica to scale of the original subject matter is separated from mold 7 as shown in FIG. 6, the product is a facsimile in relief in which both the color and the surface irregularities of the subject matter are reproduced.

In the example described above, the mold 7 is formed of a transparent or semi-transparent material, but it is also possible to use a non-transparent silicone rubber hardenable at room temperature to make the mold. In this case, the light-sensitive layer 8 formed on the irregular face 6 of the mold is covered with a transparent glass plate to protect the upper surface from air and the light-sensitive layer 8 is then exposed to light from ultraviolet lamps through the transparent glass plate above same.

Figure 7:
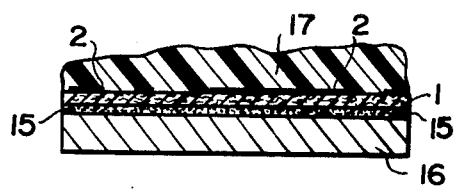
FIG. 7 represents a color reproduction mounted on a flat base and covered with a hardenable transparent resin.

Another mode of practising the invention is shown, beginning in FIG. 7, wherein a color reproduction 2 on a base 1 is placed on a flat support 16, which may be of cardboard, the top surface of which is coated with an adhesive 15. A hardenable transparent resin 17 is then applied over the imprinted face of base sheet 1.

Figure 8:
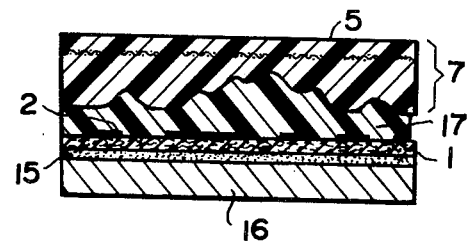
FIG. 8 shows the assembly of FIG. 7 with a mold placed in contact with said hardenable resin in order to form a reproduction of the surface of the original.
Figure 9:
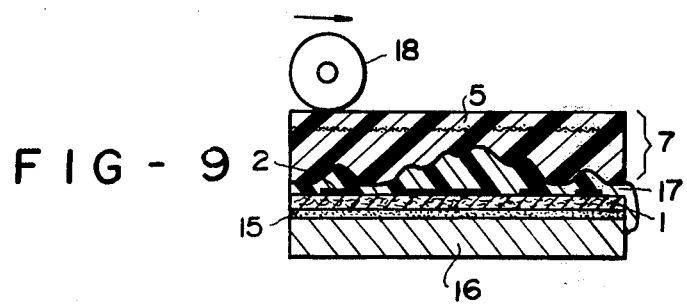
FIG. 9 shows the use of a roller on the assembly of FIG. 8 to displace air bubbles from between the mold and the hardenable resins.

After this step, a mold 7 prepared as described in connection with FIGS. 1 through 6 is placed on hardenable transparent resin 17 in registry with the printed pattern 2 on base sheet 1 (FIG. 8). The assembly is compressed with a press roller 18 (FIG. 9) thereby removing or purging air bubbles and expelling excess hardenable transparent resin from the assembly. In this way mold 7, hardenable transparent resin 17, imprinted base sheet 1 bearing the printed pattern thereon and flat support 16 are formed into a tight stack (FIG. 9).

Figure 10:
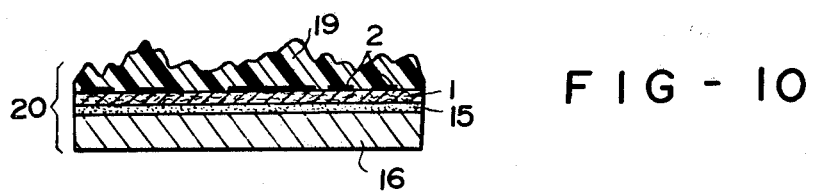
FIG. 10 shows the product achieved by use of the mold of FIG. 8 and the roller of FIG. 9.

After hardening the transparent resin 17, mold 7 is stripped away from the stack, thereby obtaining a replica in relief 20 having a structure consisting of a base sheet 1 carrying the printed pattern 2 and supported on a flat support such as cardboard by way of adhesive layer 15, the hardened resin having an irregular face 19 in registry with pattern 2, the assembly constituting a replica of the original in which such features as subtle brush touches or knife cuts or the like are accurately represented (FIG. 10). The base sheet 1 may be a printing sheet, a synthetic resin board or a metal plate. Further, support 16 may be a cardboard, cloth, synthetic resin board, metal plate, or a wooden plate. Support 16 is used only where base sheet 1 requires reinforcement, such as when base sheet 1 is a printing sheet; however, where base sheet 1 has sufficient mechanical strength by itself, no further reinforcement as by support 16 is necessary.

The hardenable resin 17 forming the moldment over the imprinted surface of the base may be a synthetic resin capable of hardening as a result of cross-linking reactions of a hardener. Examples are polyester resin, epoxy resin and acrylic resin which can be hardened at room temperature. Alternatively, a plastisol of a vinyl chloride type or a synthetic resin in the form of powder which can be rendered into liquid state by heating can be used. The vinyl chloride resin also requires heating for forming into a moldment. Subsequent to heating, the moldment is, of course, cooled.

Mold 7 may also be formed from a material composed of a silicone rubber hardenable at room temperature or a silicone resin also hardenable at room temperature or may be a combination of these materials. For adjusting the final hardness and the viscosity of the material used in the fabrication of mold 7, a suitable hardening agent such as 3% of dimethylamine and a suitable auxiliary additive such as 5% of dimethyl dichlorosilane should be added.

Where a thermosetting resin is to be used for making a moldment, instead of pressing mold 7 with roller 18 as shown in FIG. 9, it is advisable to place the assembly in a hot press 24 (FIG. 11) and to apply pressure and heat simultaneously. A relief print product such as that designated with the reference numeral 20 in FIG. 10 is thus obtained.

Figure 11:
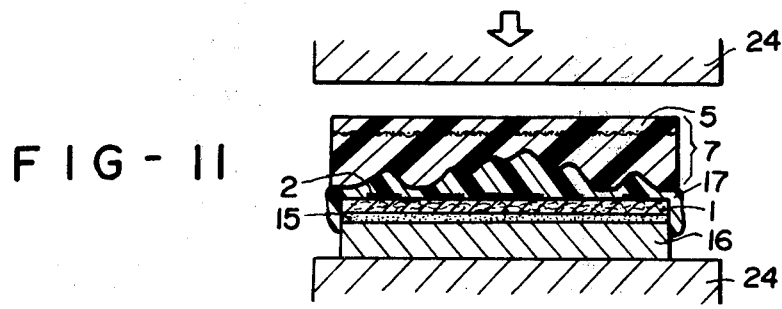
FIG. 11 shows the use of a heated press when the hardenable transparent resin is thermosetting.
Figure 12:
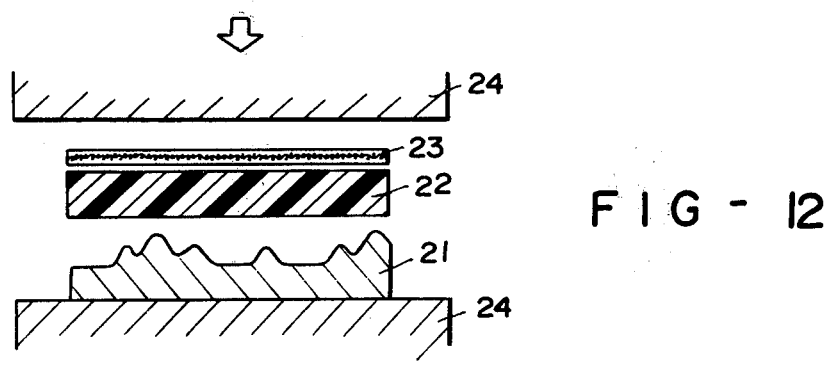
FIG. 12 shows a method of preparing a mold from a positive reproduction of the original matter, using a press.
Figure 13:
FIG. 13 shows the mold obtained by the arrangement of FIG. 12.

For large scale production, mold 7 as described above may be used as a master mold for the formation of a female mold 21 having a surface pattern corresponding to the original object to be reproduced. This female mold 21 (FIG. 12) is then used for producing male mold 25 by placing over the female mold 21 a thermoplastic resin layer 22 of a material such as polyethylene or vinyl chloride and a non-elastic sheet 23 of a polyester resin or glass fiber and subjecting the stack to thermal compression with a hot press 24 as shown in FIG. 11. Mold 25 obtained in this way (FIG. 13) consists of a thermoplastic resin body having a non-elastic sheet embedded therein and may be used in lieu of mold 7. Obviously, a large number of such molds can be prepared from female mold 21 thus facilitating large scale production.

A further embodiment of the invention is shown in FIGS. 14 and 15 wherein, as before, base sheet 1 has an imprinted pattern 2 thereon, the imprinted pattern being a photographic color reproduction of the original pattern. On this pattern and base sheet is then prepared by a skilled artisan a reproduction of the surface of the subject item to be replicated. The material used to form irregular surface 26 must have adequate viscosity, plasticity and, eventually, hardness so that it will not be affected by handling or exposure to the atmosphere. A suitable material is a transparent oil medium which has added thereto from 0.1 to 1.0% of flaxseed oil.

The product of this process 27, although not so faithfull a reproduction as is formed by the casting technique described above, nevertheless is a replica which is highly satisfactory provided the artisan has been reasonably careful in simulating the brush strokes or knife cuts of the original item. Furthermore, as aforenoted, replicas produced in this way, can be of different scale from the original which they simulate. It is only necessary that the photographic reproduction be made to the desired scale, and that the artisan adjust his technique of forming the irregular surface accordingly. Once the replica 27 is made, a positive mold can be made therefrom for forming further replicas. Furthermore a number of female molds can be made from which positive molds can be formed, these to be used in large scale production.

FIGS. 16 through 18 show the process by which a mold is prepared from a manually fabricated replica. In this case, a replica such as 27 has been used for forming an electrotype 29 having an irregular face 28. The metal mold 29 is then placed horizontally with the irregular surface 28 upward and a material hardenable by heating, such as transparent vinyl chloride plastisol is applied over the top of the mold to fill the irregular recesses and depressions on the face of the mold. Air bubbles and excess plastisol are removed by using a squeeze roller to form coating layer 30. This layer is then hardened or gelled by heating it to a temperature of from 180° to 200° C. for about ten minutes, after which the hardened coating layer 30 is cooled to about 120° C. At this point, an imprinted base sheet 1 is placed on layer 30 so that the pattern 2 is in registry with the irregularities 28 and bonding between layers 1 and 30 is achieved by applying pressure from plate 31 placed on base sheet 1. The assembly is then allowed to cool to room temperature. Plate 31 and metal mold 29 are removed thereby obtaining a relief print 33 having an irregular surface corresponding to the original backed by a photographic reproduction in proper registry with the irregularities of the surface (FIG. 18). In any of the embodiments of the invention, where the photographic reproduction may be adversely affected by heat used for hardening the transparent resin, it is advisable to paste or attach the base sheet with the photographic reproduction thereon to the resin layer subsequent to the hardening of the layer by heat. Also, bonding between base sheet 1 and any of the resin layers may be achieved by bonding with a suitably selected conventional adhesive.

In order to insure ready separation of a mold from the moldment prepared therein, it is desirable to use a base sheet of a rigid material where the mold is flexible and conversely where the base sheet is of a flexible material to use a mold which is rigid. Further, in the use of the term "hardening" herein, solidification of a fluid material to a hardness sufficient for further steps in processing and in use is the intended meaning. Hardening does not necessarily imply that the fluid is transformed into a hard or brittle state, but some flexibility may be retained in the "hardened" product.

It will thus be seen that the objects set forth above, among those made apparent from the preceding description, are efficiently attained and, since certain changes may be made in carrying out the above process and in the article set forth without departing from the spirit and scope of the invention, it is intended that all matter contained in the above description and shown in the accompanying drawings shall be interpreated as illustrative and not in a limiting sense.

It is also to be understood that the following claims are intended to cover all of the generic and specific features of the invention herein described, and all statements of the scope of the invention which, as a matter of language, might be said to fall therebetween.

We claim:

1. A relief printing process suitable for reproducing in mass-production the color and surface irregularities of subject matter including art works, crafts and oil paintings, comprising the steps of preparing a first mold of a hardenable material, said mold being the inverse on a selected scale of said subject matter, preparing a transparent moldment in said mold, said moldment having one flat face, preparing a color reproduction of said subject matter on the same selected scale, and joining said flat face of said moldment to said color reproduction so that the irregularities in said moldment are in registry with said color reproduction as in said subject matter.

2. The process as defined in claim 1 wherein said hardenable material is a silicone resin.

3. The process as defined in claim 1 wherein a non-elastic material in essentially sheet-like form is embedded in said hardenable material prior to hardening for the purpose of increasing the dimensional stability of said mold.

4. The process as defined in claim 3 wherein said non-elastic sheet is of a member of the group consisting of glass fiber and polyester fiber.

5. The process as defined in claim 1 wherein said hardenable resin is hardenable by and is hardened by light or by addition of an initiator.

6. The process as defined in claim 1 wherein said color reproduction is printed on a substrate similar to that of said subject matter.

7. The process as defined in claim 1 further comprising the step of joining the flat face of said moldment in registry to a color reproduction of the subject matter to be reproduced using a roller for removing air bubbles from therebetween.

8. The process as defined in claim 1 wherein said moldments are made from a resin selected from the group consisting of polyesters epoxies vinyl chloride and acrylics.

9. The process as defined in claim 1 wherein said mold is made of a thermosetting material.

10. The process as defined in claim 1 wherein at least one of said first mold and said moldment is sufficiently flexible to facilitate the separation of one from the other at the conclusion of the step of forming said moldment.

11. The process as defined in claim 1 wherein the preparation of said first mold includes the steps of preparing manually a replica of the subject matter, said replica reproducing the surface irregularities of the subject matter as closely as may be desired, applying a hardenable material to the irregular surface of said replica, said hardenable material being selected to be non-reactive with said replica and to be dimensionally stable and easily removable from said replica when hardened, causing said hardenable material to harden in contact with said replica and stripping said hardenable material from said replica, thereby forming a mold for the production of moldments which can be joined to photographic reproductions of the subject matter to prepare facsimiles of said original subject matter.

12. The process as defined in claim 11 wherein said hardenable material is a silicone resin.

13. The process as defined in claim 11 wherein a non-elastic material in essentially sheet-like form is embedded in said hardenable material prior to hardening for the purpose of increasing the dimensional stability of said mold.

14. The process as defined in claim 13 wherein said non-elastic sheet is of glass fiber, or polyester resin.

15. The process as defined in claim 11 wherein said moldment is of a hardenable resin.

16. The process as defined in claim 11 wherein said hardenable material is hardenable by and is hardened by light or by addition of an initiator.

17. The process as defined in claim 11 wherein said color reproduction is printed on a substrate similar to that of said subject matter.

18. The process as defined in claim 11, further comprising the step of joining the flat face of said moldment in registry to a color reproduction of the subject matter to be reproduced, using a roller for removing air bubbles from therebetween.

19. The process as defined in claim 1 wherein said moldment is made from a resin selected from the group consisting of polyesters epoxies vinyl chloride and acrylics.

20. The process as defined in claim 11 wherein said hardenable material containing an initiator constituting said moldment is applied to said mold as a powder, is heated to convert into a liquid and then cooled to harden same.

21. The process as defined in claim 11 wherein said mold is made of a thermosetting material.

22. The process as defined in claim 11, wherein at least one of said mold and said moldment is sufficiently flexible to facilitate the separation of one from the other at the conclusion of the step of forming said moldment.

23. The relief printing process as defined in claim 1 wherein said moldment is formed from a hardenable composition while said composition is in contact with said color reproduction, said mold being in registry with said color reproduction during formation of said moldment.

24. A relief printing process suitable for reproducing in mass-production the color and surface irregularities of subject matter including art works, crafts and oil paintings, comprising the steps of manually preparing a replica thereof on a selected scale, preparing a color reproduction of said subject matter on said selected scale, forming an assembly which consists of said mold, a hardenable transparent resin and said color reproduction, said hardenable transparent resin being placed between said mold and said color reproduction and said mold being in registry with said color reproduction, compressing said assembly to remove any trapped air bubbles and excess resin, hardening said transparent resin, and removing said mold from said assembly.

25. The process as defined in claim 24, wherein said assembly is prepared by placing said hardenable transparent resin over said color reproduction and applying said mold to said hardenable transparent resin before hardening said resin.

26. The process as defined in claim 25, wherein a roller is used for compressing said assembly to remove any trapped air bubbles and excess resin.

27. A color facsimile of subject matter including oil paintings, art works and crafts, comprising a color reproduction of said subject matter to a selected scale and a moldment of a transparent resin to the same scale as said color reproduction, said moldment having one flat face and a second face with irregularities thereon reproducing to said selected scale the irregularities on said subject matter, said moldment being joined at the flat face thereof to said color reproduction so that the irregularities are in registry with said color reproduction as in said subject matter.

* * * * *